United States Patent
Ogawa

(10) Patent No.: US 8,366,867 B2
(45) Date of Patent: Feb. 5, 2013

(54) BONDED STRUCTURE, SEALED STRUCTURE, ELECTRONIC COMPONENT INCLUDING THE SAME, BONDING METHOD, AND SEALING METHOD

(75) Inventor: Kazufumi Ogawa, Awa (JP)

(73) Assignee: Empire Technology Development LLC, Wilmington, DE (US)

( * ) Notice: Subject to any disclaimer, the term of this patent is extended or adjusted under 35 U.S.C. 154(b) by 429 days.

(21) Appl. No.: 12/664,723

(22) PCT Filed: Jun. 20, 2008

(86) PCT No.: PCT/JP2008/061327
§ 371 (c)(1),
(2), (4) Date: Dec. 15, 2009

(87) PCT Pub. No.: WO2009/001773
PCT Pub. Date: Dec. 31, 2008

(65) Prior Publication Data
US 2010/0181090 A1      Jul. 22, 2010

(30) Foreign Application Priority Data
Jun. 25, 2007   (JP) ................................ 2007-166598

(51) Int. Cl.
| | | |
|---|---|---|
| B29C 65/00 | (2006.01) | |
| B31B 1/60 | (2006.01) | |
| B32B 37/00 | (2006.01) | |
| C04B 37/00 | (2006.01) | |
| B41J 2/16 | (2006.01) | |
| C09J 163/00 | (2006.01) | |
| H01J 5/00 | (2006.01) | |
| H01J 15/00 | (2006.01) | |
| H05K 5/06 | (2006.01) | |

(52) U.S. Cl. .......... 156/325; 156/60; 156/326; 156/330; 174/50.5

(58) Field of Classification Search .................... 156/60, 156/325, 326, 330; 174/50.5
See application file for complete search history.

(56) References Cited

U.S. PATENT DOCUMENTS
4,822,426 A * 4/1989 Ito et al. ................. 106/218
4,981,728 A * 1/1991 Homma et al. ............. 427/386
(Continued)

FOREIGN PATENT DOCUMENTS
JP   62-289280   12/1987
JP   64-060680    3/1989
(Continued)

OTHER PUBLICATIONS
International Preliminary Report on Patentability for PCT/JP2008/061327 mailed Jan. 21, 2010 (with English translation).
(Continued)

Primary Examiner — Michael Orlando
(74) Attorney, Agent, or Firm — Foley & Lardner LLP

(57) ABSTRACT

Provided are a bonded structure, a sealed structure, an electronic component including the same, a bonding method, and a sealing method, the bonded structure and sealed structure allow hermetic adhesion using an adhesive even when the materials of the bonding surfaces are different, or the bonding surfaces have low wettability for the adhesive. A sealed structure 21 used for an electronic component or the like includes a first bonding surface 17 on a first adherent 11 bonded to a second bonding surface 18 on a second adherent 16 via an adhesive layer 24, the first and/or second bonding surfaces 17 and 18 having films 22 and 23 of film-forming compounds, the film-forming compounds being bound to the surfaces 17 and 18 at one end of the molecule thereof, and bound to a molecule of the adhesive at the functional group at the other end of the molecule.

5 Claims, 3 Drawing Sheets

U.S. PATENT DOCUMENTS

| | | |
|---|---|---|
| 5,248,334 A | 9/1993 | Fey |
| 5,835,256 A | 11/1998 | Huibers |
| 2005/0099089 A1 | 5/2005 | Baumgartner |
| 2005/0116329 A1* | 6/2005 | Chandran et al. ............. 257/678 |

FOREIGN PATENT DOCUMENTS

| | | |
|---|---|---|
| JP | 02-212577 | 8/1990 |
| JP | 02-310527 | 12/1990 |
| JP | 05-174733 | 7/1993 |
| JP | 06-082600 | 3/1994 |
| JP | 2007-117826 | 3/1994 |
| JP | 11-100238 | 4/1999 |
| JP | 2003-309227 | 10/2003 |
| JP | 2005-139458 | 6/2005 |
| JP | 2005-534048 | 11/2005 |
| JP | 2007-013026 | 1/2007 |

OTHER PUBLICATIONS

International Search Report (with English translation) for PCT/JP2008/061327, mailed Jul. 22, 2008.

* cited by examiner

WHERE ⦻ EXPRESSES $E-(CH_2)_m-\underset{\underset{O-}{|}}{\overset{\overset{O-}{|}}{Si}}-O-$

BONDED STRUCTURE, SEALED STRUCTURE, ELECTRONIC COMPONENT INCLUDING THE SAME, BONDING METHOD, AND SEALING METHOD

CROSS-REFERENCE TO RELATED APPLICATIONS

The present application is a U.S. national stage application claiming the benefit of International Application No. PCT/JP2008/061327, filed on Jun. 20, 2008, which claims the benefit of Japanese Application No. 2007-166598, filed on Jun. 25, 2007, the entire contents of which are incorporated herein by reference in their entirety.

TECHNICAL FIELD

The present invention relates to a bonded structure, a sealed structure, an electronic component including the same, a bonding method, and a sealing method.

BACKGROUND ART

It is a well known technique to bond together a pair of opposed bonding surfaces using an adhesive such as an instantaneous, photocurable, or hot melt adhesive. An adhesive is applied onto one or both of the bonding surfaces, and the adhesive wetting the surfaces is cured thereby progressing adhesion between the pressure-bonded surfaces.

Wettability of the bonding surfaces for an adhesive depends on the chemical properties (for example, hydrophilicity, hydrophobicity, and surface energy) of the bonding surfaces and the adhesive. Therefore, if the materials of bonding surfaces are different or the bonding surfaces are composed of fluorocarbon materials, the bonding surfaces have insufficient wettability for an adhesive. Accordingly, in such cases, it is difficult to achieve hermetic adhesion using an adhesive.

Electronic components such as semiconductor devices, image sensors, line sensors, liquid crystal displays (LCDs), plasma display panels (PDPs), and electroluminescence (EL) displays must be sealed in packages to prevent degradation by penetration of water. These electronic components requires bonding of surfaces composed of different materials. As described above, in such cases, sufficient hermeticity cannot be achieved with an adhesive, so that a welding method (for example, see Patent Document 1), a solder sealing method (for example, see Patent Document 2), or a low melting point glass sealing method (for example, see Patent Document 3) is used.

Patent Document 1: Japanese Unexamined Patent Application Publication No. 5-174733
Patent Document 2: Japanese Unexamined Patent Application Publication (Translation of PCT Application) No. 2005-534048
Patent Document 3: Japanese Unexamined Patent Application Publication No. 2007-13026

DISCLOSURE OF INVENTION

Problems to be Solved by the Invention

However, the welding method, solder sealing method, and low melting point glass sealing method require high temperatures for adhesion and sealing, which increases the production cost and causes problems such as thermal deformation of the bonding surfaces and degradation of the adherents. In addition, these methods are poorly applicable to bonding surfaces composed of resin materials.

The present invention has been accomplished in view of the above-described problems, and is intended to provide a bonded structure, a sealed structure, an electronic component including the same, a bonding method, and a sealing method, thereby achieving hermetic adhesion with an adhesive even if the materials of both of the bonding surfaces are different, or the bonding surfaces have low wettability for the adhesive.

Means for Solving the Problem

A bonded structure for achieving the above-described object according to a first aspect of the present invention is a bonded structure including a first bonding surface on a first adherent bonded to a second bonding surface on a second adherent via an adhesive layer, the first and/or second bonding surfaces having a film of a film-forming compound, the film-forming compound being bound to the surface at one end of the molecule thereof, and bound to a molecule of the adhesive via a functional group at the other end of the molecule.

A sealed structure according to a second aspect of the present invention is a sealed structure including a first bonding surface on a first adherent hermetically bonded to a second bonding surface on a second adherent via an adhesive layer, the first and/or second bonding surfaces having a film of a film-forming compound, the film-forming compound being bound to the surface at one end of the molecule thereof, and bound to a molecule of the adhesive via a functional group at the other end of the molecule.

In the sealed structure according to the second aspect of the present invention, the first and/or second adherents may be metal, ceramic, glass, or plastic.

In the sealed structure according to the second aspect of the present invention, the film of the film-forming compound is preferably a monomolecular film.

An electronic component according to a third aspect of the present invention includes the sealed structure according to the second aspect of the present invention. The electronic component according to the third aspect of the present invention may be a semiconductor device, an image sensor, a line sensor, a liquid crystal display (LCD), a plasma display panel (PDP), or an electroluminescence (EL) display sealed in a package.

A bonding method according to a fourth aspect of the present invention includes: step A of bringing a first film-forming compound having at each end of the molecule thereof a first functional group that forms a bond with a molecule of an adhesive and a first surface bonding group into contact with a first bonding surface of a first adherent thereby binding the first surface bonding group to the surface functional group of the first bonding surface to form a film of the first film-forming compound on the first bonding surface; step B of bringing a second film-forming compound having at each end of the molecule thereof a second functional group for forming a bond with a molecule of the adhesive and a second surface bonding group into contact with a second bonding surface of a second adherent to thereby binding the second surface bonding group to the surface functional group of the second bonding surface to form a film of the second film-forming compound on the second bonding surface; and step C of bringing the first bonding surface having a film of the first film-forming compound into contact by pressure with the second bonding surface having a film of the second film-forming compound while setting the adhesive to be in contact with the first and second functional groups, thereby binding the first and second functional groups to the molecule of the adhesive.

A sealing method according to a fifth aspect of the present invention includes: step A of bringing a first film-forming compound having at each end of the molecule thereof a first functional group that forms a bond with the molecule of an adhesive and a first surface bonding group into contact with a first bonding surface on the edge of the first adherent thereby binding the first surface bonding group to the surface functional group of the first bonding surface to selectively form a film of the first film-forming compound on the first bonding surface; step B of bringing a second film-forming compound having at each end of the molecule thereof a second functional group that forms a bond with the molecule of the adhesive and a second surface bonding group into contact with contacting a second bonding surface on the edge of a second adherent thereby binding the second surface bonding group to the surface functional group of the second bonding surface to selectively form a film of the second film-forming compound on the second bonding surface; and step C of bringing the first bonding surface having a film of the first film-forming compound into contact by pressure with the second bonding surface having a film of the second film-forming compound while setting the adhesive to be in contact with the first and second functional groups, thereby binding the first and second functional groups to the molecule of the adhesive.

In the sealing method according to the fifth aspect of the present invention, the first and second functional groups may be amino groups or imino groups, and the molecule of the adhesive may have an epoxy group.

In the sealing method according to the fifth aspect of the present invention, the first and second surface bonding groups may be alkoxysilyl groups.

In the step C of the sealing method according to the fifth aspect of the present invention, the temperature of the first or second adherent having a higher coefficient of linear expansion is preferably lower than the temperature of the other adherent having a lower coefficient of linear expansion.

In the sealing method according to the fifth aspect of the present invention, it is preferable that both of the films of the first and second film-forming compounds be monomolecular films.

Advantageous Effect of the Invention

In the bonded structure according to the first aspect of the present invention, the functional group of the film-forming compound bound to the bonding surface is bound to the molecule of the adhesive thereby achieving high bonding strength regardless of the wettability of the bonding surface for an adhesive. As a result of this, higher adhesive strength is achieved even if both of the bonding surfaces are different in wettability for the adhesive, or have insufficient wettability for the adhesive.

In the sealed structure according to the second to fourth aspects of the present invention, the functional group of the film-forming compound bound to the bonding surface is bound to the molecule of the adhesive thereby securing high bonding strength and hermeticity regardless of the wettability of the bonding surface for the adhesive. As a result of this, sealing is achieved with high strength and higher reliability even if both of the bonding surfaces are different in wettability for the adhesive, or have insufficient wettability for the adhesive.

In the sealed structure according to the third aspect of the present invention, the first and/or second adherents are metal, ceramic, glass, or plastic thereby favorably producing a sealed body with high hermeticity.

In the sealed structure according to the fourth aspect of the present invention, the film of the film-forming compound is a monomolecular film thereby achieving excellent strength and reliability.

The electronic component according to the fifth and sixth aspect of the present invention includes the sealed structure according to the second to fourth aspects of the present invention, whereby the electric component is produced at a low cost, resists degradation by penetration of moisture, and has excellent reliability.

In a bonding method according to a seventh aspect of the present invention, firstly, a film of the film-forming compound bound to the bonding surface is formed, and then the first and second functional groups of the film-forming compound are bound to the molecule of the adhesive thereby securing high bonding strength regardless of the wettability of the bonding surface for the adhesive. As a result of this, higher adhesive strength is achieved even if both of the bonding surfaces are different in wettability for the adhesive, or have insufficient wettability for the adhesive.

In sealing methods according to eighth to twelfth aspects of the present invention, firstly, a film of the film-forming compound bound to the bonding surface is formed, and then the first and second functional groups of the film-forming compound are bound to the molecule of the adhesive thereby securing high bonding strength and hermeticity regardless of the wettability of the bonding surface for the adhesive. As a result of this, sealing is achieved with high strength and higher reliability even if both of the bonding surfaces are different in wettability for the adhesive, or have insufficient wettability for the adhesive.

In the sealing method according to the ninth aspect of the present invention, the first and second functional groups are amino groups or imino groups, and the molecule of the adhesive contains an epoxy group, whereby sealing is achieved with high peel resistance and high hermeticity.

In the sealing method according to the twelfth aspect of the present invention, the first and second surface bonding groups are alkoxysilyl groups, whereby sealing is achieved with high peel resistance and high hermeticity.

In the step C of the sealing method according to the eleventh aspect of the present invention, the temperature of the first or second adherent having a higher coefficient of linear expansion is lower than the temperature of the other adherent having a lower coefficient of linear expansion, whereby the occurrence of distortion due to the difference of the coefficients of linear expansion of the bonding surfaces is prevented, and sealing is achieved with high peel resistance and high hermeticity during practical use.

In the sealing method according to the twelfth aspect of the present invention, both of the films of the first and second film-forming compounds are monomolecular films, whereby the number of chemical bonds bound to the molecule of the adhesive is large, and sealing is achieved with high peel resistance and high hermeticity.

BEST MODE FOR CARRYING OUT THE INVENTION

The embodiments of the present invention are described below with reference to the accompanied drawings for a better understanding of the present invention.

Figure 1:
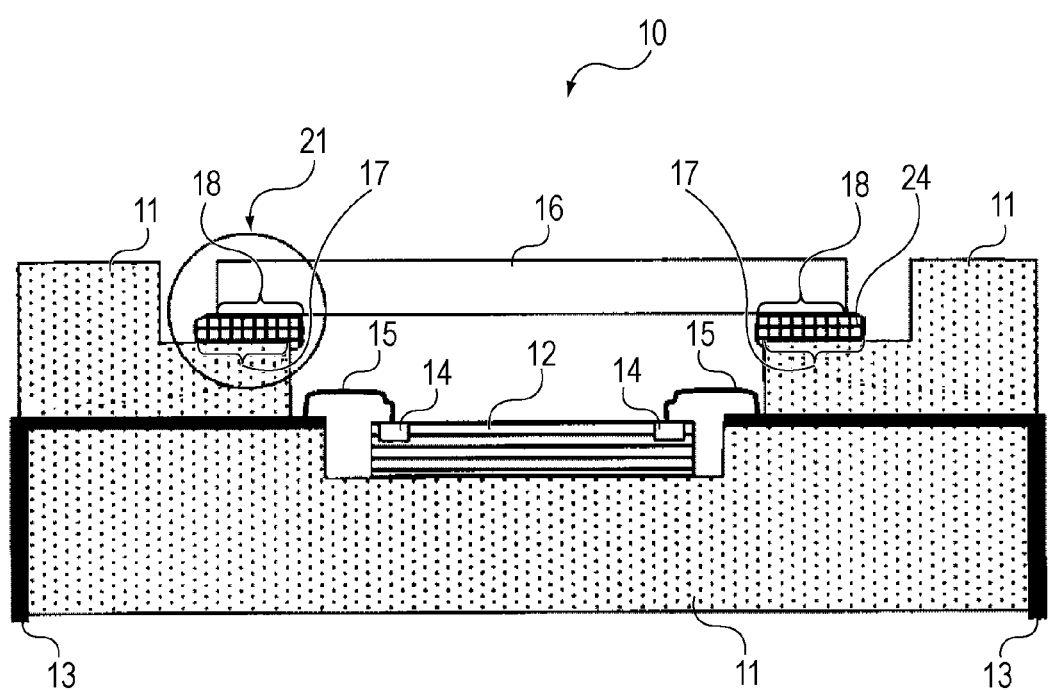
FIG. 1 is an explanatory drawing schematically showing a section of an image sensor having the sealed structure according to one embodiment of the present invention.
Figure 2:
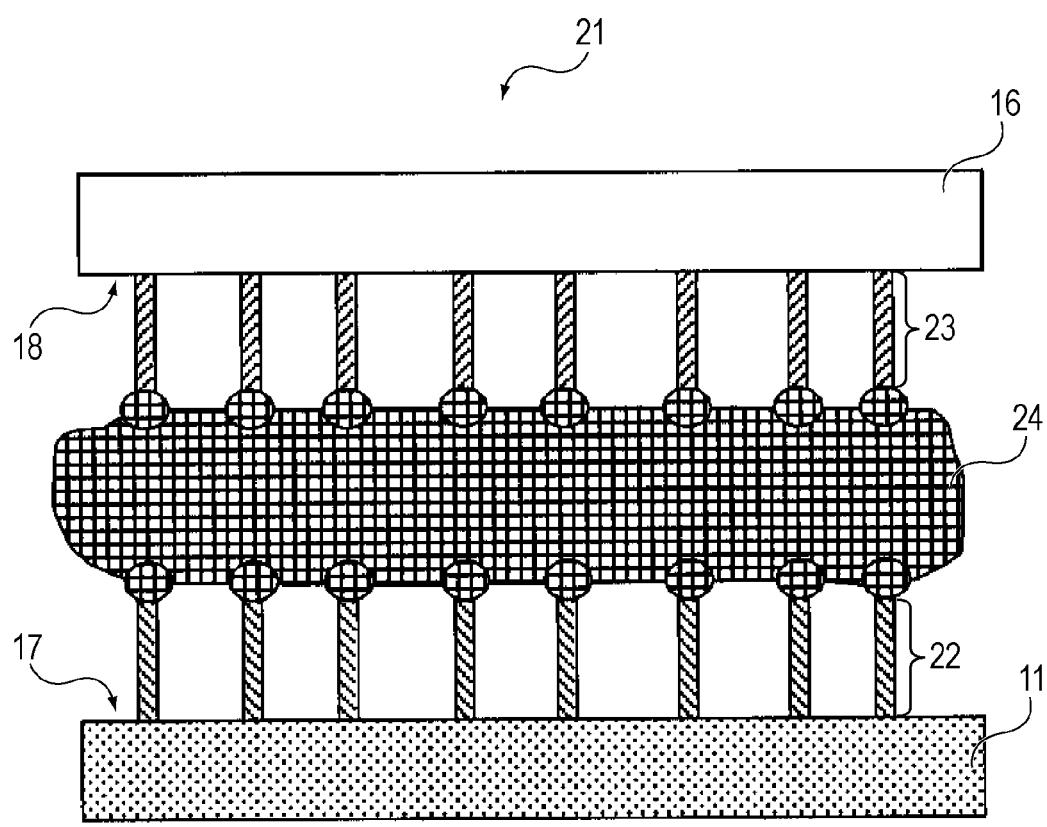
FIG. 2 is a schematic diagram enlarged to a molecular level showing the sealed structure of the image sensor.
Figure 3:
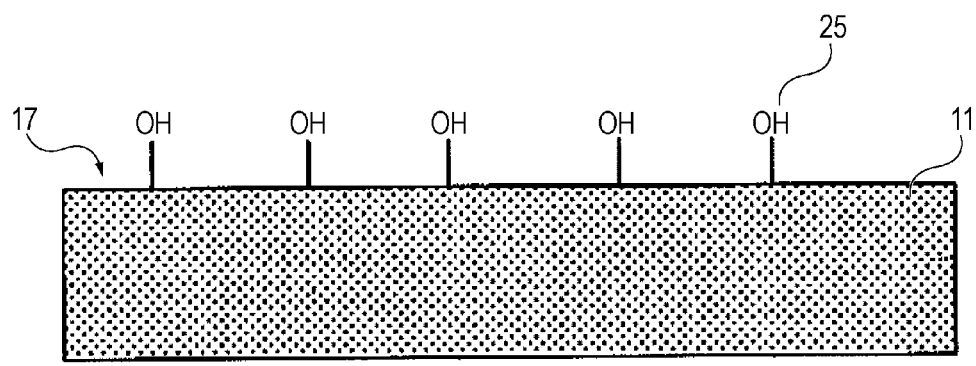
FIG. 3 is a schematic diagram enlarged to a molecular level illustrating the step of forming a monomolecular film of the first film-forming compound on the first bonding surface of a ceramic package, wherein (A) shows a cross section structure of the ceramic package before reaction, and (B) shows a cross section structure of the ceramic package having the monomolecular film of the first film-forming compound.
Figure 3:
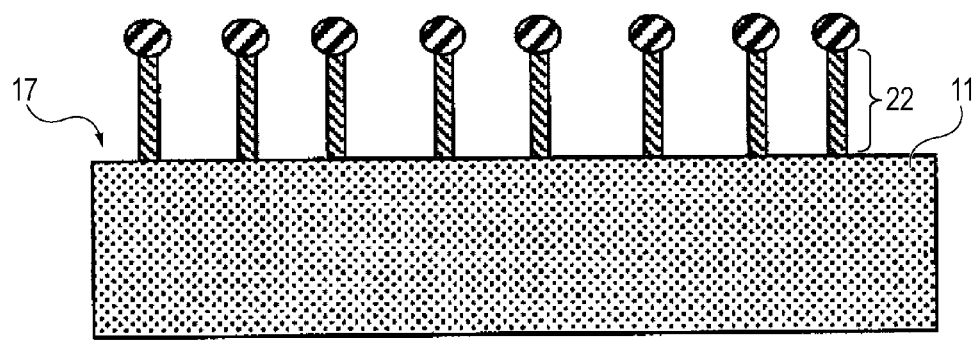

FIG. 1 is an explanatory drawing schematically showing a section of an image sensor having the sealed structure according to one embodiment of the present invention, FIG. 2 is a schematic diagram enlarged to a molecular level showing the sealed structure of the image sensor, and FIG. 3 is a schematic diagram enlarged to a molecular level illustrating the step of forming a monomolecular film of the first film-forming compound on the first bonding surface of a ceramic package, wherein FIG. 3(A) shows a cross section structure of the ceramic package before reaction, and FIG. 3(B) shows a cross section structure of the ceramic package having the monomolecular film of the first film-forming compound.

As shown in FIG. 1, an image sensor (an example of the electronic component) 10 including a sealed structure 21 according to one embodiment of the present invention has a sensor chip 12 mounted on a ceramic package (an example of the first adherent) 11. The ceramic package 11 is provided with leads 13. The leads 13 are electrically connected to electrode pads 14 for electrically connecting the sensor chip 12 to the external circuit via electrically conductive wires 15.

The image sensor 10 has a transparent window plate glass 16 (an example of the second adherent) for protecting the sensor chip 12 with securing entrance of light. In order to prevent degradation of the sensor chip 12 caused by exposure to moisture, a first bonding surface 17 on the ceramic package 11 is hermetically bonded to a second bonding surface 18 on the window plate glass 16 via an epoxy type adhesive (an example of the adhesive) layer (adhesive layer) 24 thereby forming a sealing structure 21 (circled area in FIG. 1).

As shown in FIG. 2, a monomolecular film 22 (an example of the film) of the first film-forming compound, which is bound to the surface of the first bonding surface 17 at one end of the molecule thereof and has an epoxy group (an example of the first functional group) for forming a bond with a molecule of the epoxy type adhesive at the other end of the molecule, is formed on the surface of the first bonding surface 17 on the edge of the ceramic package 11, a monomolecular film 23 (an example of the film) of the second film-forming compound, which is bound to the surface of the second bonding surface 18 at one end of the molecule thereof and has an epoxy group (an example of the second functional group) for bonding with a molecule of the epoxy type adhesive at the other end of the molecule, is formed on the second bonding surface 18 on the edge of the window plate glass 16, the molecule of the adhesive forming the adhesive layer 24 being bound to the epoxy groups of the first and second film-forming compounds.

The sealed structure 21 is formed by a bonding method including: step A of bringing the first film-forming compound having at each end of one molecule thereof an epoxy group and an alkoxysilyl group (an example of the first bonding group) into contact with the first bonding surface 17 thereby binding the alkoxysilyl group to the hydroxy group 25 (an example of the surface functional group) of the first bonding surface 17 to selectively form the monomolecular film 22 of the first film-forming compound on the first bonding surface 17 (see FIGS. 3(A) and 3(B)); step B of bringing the second film-forming compound having at each end of the molecule thereof an epoxy group and an alkoxysilyl group (an example of the second bonding group) into contact with the second bonding surface 18 thereby binding the alkoxysilyl group to the hydroxy group (an example of the surface functional group) of the second bonding surface 18 to selectively form the monomolecular film 23 of the second film-forming compound on the second bonding surface 18 (see FIGS. 3(A) and 3(B)); and step C of bringing the first bonding surface 17 having the monomolecular film 22 of the first film-forming compound into contact by pressure with the second bonding surface 18 having the monomolecular film 23 of the second film-forming compound while setting the epoxy type adhesive to be in contact with the epoxy groups of the first and second film-forming compounds, thereby binding the epoxy groups of the first and second film-forming compounds to the molecule of the epoxy type adhesive forming the adhesive layer 24 (see FIG. 2).

The Steps A to C are Further Described Below in Detail

In the step A, the first bonding surface 17 on the edge of the ceramic package 11 is brought into contact with the first film-forming compound having at the ends of the molecule thereof an epoxy group and an alkoxysilyl group thereby binding the alkoxysilyl group to the hydroxy group 25 on the first bonding surface 17 to selectively form the monomolecular film 22 of the first film-forming compound on the first bonding surface (see FIGS. 3(A) and 3(B)).

The first film-forming compound having an epoxy group may be any compound capable of adsorbing or adhering to the surface of the ceramic package 11 to form a monomolecular film through self-organization. The compound is preferably the alkoxysilane compound expressed by the general formula (Chemical formula 1) having an epoxy group (oxirane ring)-containing functional group at one end, and an alkoxysilyl group at the other end of the linear alkylene group.

[Chemical formula 1]

In the above formula, E represents an epoxy group-containing functional group, m represents an integer of 3 to 20, and R represents an alkyl group having 1 to 4 carbon atoms.

Specific examples of the epoxy group-containing first film-forming compound include the following alkoxysilane compounds (1) to (12).

(1) $(CH_2OCH)CH_2O(CH_2)_3Si(OCH_3)_3$
(2) $(CH_2OCH)CH_2O(CH_2)_7Si(OCH_3)_3$
(3) $(CH_2OCH)CH_2O(CH_2)_{11}Si(OCH_3)_3$
(4) $(CH_2CHOCH(CH_2)_2)CH(CH_2)_2Si(OCH_3)_3$
(5) $(CH_2CHOCH(CH_2)_2)CH(CH_2)_4Si(OCH_3)_3$
(6) $(CH_2CHOCH(CH_2)_2)CH(CH_2)_6Si(OCH_3)_3$
(7) $(CH_2OCH)CH_2O(CH_2)_3Si(OC_2H_5)_3$
(8) $(CH_2OCH)CH_2O(CH_2)_7Si(OC_2H_5)_3$
(9) $(CH_2OCH)CH_2O(CH_2)_{11}Si(OC_2H_5)_3$
(10) $(CH_2CHOCH(CH)_2)_2CH(CH_2)_2Si(OC_2H_5)_3$
(11) $(CH_2CHOCH(CH)_2)_2CH(CH_2)_4Si(OC_2H_5)_3$
(12) $(CH_2CHOCH(CH)_2)_2CH(CH_2)_6Si(OC_2H_5)_3$

In the above formulae, the (CH$_2$OCH)CH$_2$— group represents the functional group (glycidyl group) expressed by Chemical formula 2, and the (CH$_2$CHOCH(CH$_2$)$_2$)CH— group represents the functional group (3,4-epoxycyclohexyl group) expressed by Chemical formula 3.

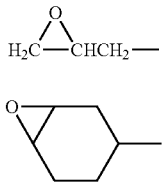

[Chemical formula 2]

[Chemical formula 3]

The monomolecular film 22 of the first film-forming compound is formed by applying a reaction mixture comprising an epoxy group-containing alkoxysilane compound, a condensation catalyst for accelerating the condensation reaction between the alkoxysilyl group and the hydroxy group 25 of the surface of the ceramic package 11 and a nonaqueous organic solvent onto the first bonding surface 17 on the edge of the ceramic package 11, and then allowing the reaction mixture to react in air at room temperature. The application may be carried out by, for example, screen printing or ink jet printing.

Examples of the condensation catalyst include metal carboxylates, carboxylic acid ester metal salts, metal carboxylate polymers, metal carboxylate chelates, and metal salts of titanate esters and titanate ester chelates.

The content of the condensation catalyst is preferably from 0.2 to 5% by mass, more preferably from 0.5 to 1% by mass based on the alkoxysilane compound.

Specific examples of the metal carboxylates include stannous acetate, dibutyltin dilaurate, dibutyltin dioctate, dibutyltin diacetate, dioctyltin dilaurate, dioctyltin dioctate, dioctyltin diacetate, stannous dioctanoate, lead naphthenate, cobalt naphthenate, and 2-iron ethylhexenoate.

Specific examples the carboxylic acid ester metal salts include dioctyltin bisoctylthioglycolate and dioctyltin maleate.

Specific examples the metal carboxylate polymers include a dibutyltin maleate polymer and a dimethyltin mercaptopropionate polymer.

Specific examples the metal carboxylate chelates include dibutyltin bisacetyl acetate and dioctyltin bisacetyl laurate.

Specific examples the titanate esters include tetrabutyl titanate and tetranonyl titanate.

Specific examples the titanate ester chelates include bis (acetylacetonyl)di-propyltitanate.

The alkoxysilyl group and the hydroxy group 25 of the surface or the ceramic package 11 cause condensation reaction to form the monomolecular film 22 of the first film-forming compound having the epoxy group-containing structure expressed by Chemical formula 4. The three single bonds extending from the oxygen atoms are each bound to the surface of the ceramic package 11 or a silicon (Si) atom of an adjacent silane compound, and at least one of the single bonds is bound to the surface of the ceramic package 11 (for example, an aluminum atom on an alumina package).

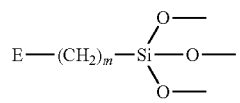

[Chemical formula 4]

An alkoxysilyl group is decomposed in the presence of moisture, so that its reaction is preferably carried out in air having a relative humidity of 45% or less. The condensation reaction is inhibited by oil, fat, and moisture sticking to the surface of the ceramic package 11. Therefore, it is preferable that these impurities be removed in advance by thoroughly washing and drying the ceramic package 11.

When any of the above-described metal salts is used as the condensation catalyst, the period required to complete the condensation reaction is about 2 hours.

The reaction period can be reduced by about ½ to ⅔ by replacing the metal salt as the condensation catalyst with one or more compounds selected from the group consisting of ketimine compounds, organic acids, aldimine compounds, enamine compounds, oxazolidine compounds, and aminoalkylalkoxysilane compounds.

Alternatively, the reaction period can be further reduced by using any of the above compounds as a co-catalyst in combination with the metal salt at a mass ratio of 1:9 to 9:1, preferably about 1:1.

For example, when the monomolecular film 22 of the first film-forming compound is formed under the same conditions as described above, except that H3 manufactured by Japan Epoxy Resins Co., Ltd., which is a ketimine compound, is used as the condensation catalyst in place of dibutyltin bisacetyl acetate, which is a metal carboxylate chelate, the reaction period is reduced to about 1 hour without loss of the quality of the ceramic package 11.

The reaction period of the formation of the monomolecular film 22 of the first film-forming compound can be further reduced to about 20 minutes through the use of a mixture of H3 (manufactured by Japan Epoxy Resins Co., Ltd.) and dibutyltin bisacetyl acetonate (mixing ratio is 1:1) as the condensation catalyst, where the other conditions are the same as described above.

The ketimine compounds which may be used herein are not particularly limited, and examples thereof include 2,5,8-triaza-1,8-nonadiene, 3,11-dimethyl-4,7,10-triaza-3,10-tridecadiene, 2,10-dimethyl-3,6,9-triaza-2,9-undecadiene, 2,4,12,14-tetramethyl-5,8,11-triaza-4,11-pentadecadiene, 2,4,15,17-tetramethyl-5,8,11,14-tetraaza-4,14-octadecadiene, 2,4,20,22-tetramethyl-5,12,19-triaza-4,19-trieicosadiene.

The organic acid which may be used herein are also not particularly limited, and examples thereof include formic acid, acetic acid, propionic acid, butyric acid, and malonic acid.

Preparation of the Reaction Mixture May Use Organic Chlorine Solvents, hydrocarbon solvents, fluorocarbon solvents, silicone solvents, and mixture of these solvents. In order to prevent hydrolysis of the alkoxysilane compound, it is preferable that moisture be removed from the solvent used herein with a drying agent or through distillation. The boiling point of the solvent is preferably from 50 to 250° C.

Specific examples of the solvent which may be used herein include nonaqueous petroleum naphtha, solvent naphtha, petroleum ether, petroleum benzene, isoparaffin, normal paraffin, decalin, industrial gasoline, nonane, decane, heating oil, dimethyl silicone, phenyl silicone, alkyl-modified silicone, polyether silicone, and dimethylformamide.

Other examples include alcohol solvents such as methanol, ethanol, and propanol, and mixtures thereof.

Examples of the fluorocarbon solvents which may be used herein include chlorofluorocarbon solvents, FLUORINERT (manufactured by 3M United States) and AFLUID (manufactured by Asahi Glass Co., Ltd.). These solvents may be used alone or in combination of two or more if they are miscible with each other, and may be mixed with an organic chlorine solvent such as dichloromethane or chloroform.

In the reaction mixture, the concentration of the alkoxysilane compound is preferably from 0.5 to 3% by mass.

After completion of the reaction, the excessive alkoxysilane compound and condensation catalyst remaining on the surface as unreacted residues are washed off with a solvent thereby forming the monomolecular film 22 of the first film-forming compound on the first bonding surface 17. FIG. 3(B) shows a schematic view of the surface of the first bonding surface 17 having thereon the monomolecular film 22 of the first film-forming compound which has been formed as described above.

The washing solvent may be any solvent capable of dissolving the alkoxysilane compound, and for example, dichloromethane, chloroform, or N-methylpyrrolidone are preferred because these solvents are inexpensive, can dissolve the alkoxysilane well, and are easy to remove by air drying.

After completion of the reaction, if the surface is allowed to stand in air without washing with a solvent, the alkoxysilane compound remaining on the surface is partially hydrolyzed by moisture in air to form a silanol group, which causes condensation reaction with the alkoxysilyl group. As a result of this, a very thin polymer film composed of polysiloxane is formed on the first bonding surface 17. The polymer film is not wholly fixed to the first bonding surface 17 via covalent bonds, but is as reactive as the monomolecular film 22 of the first film-forming compound due to its epoxy groups. Therefore, the subsequent manufacturing process will not be markedly affected even if no washing is conducted.

The epoxy group-containing alkoxysilane compound used in the present embodiment may be replaced with other alkoxysilane compound expressed by the following general formula (Chemical formula 5) having an amino group at one end of its linear alkylene group and an alkoxysilyl group at the other end:

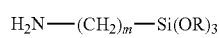
[Chemical formula 5]

wherein m represents an integer of 3 to 20, and R represents an alkyl group having 1 to 4 carbon atoms.

Specific examples of the amino-group containing film-forming compound include the following alkoxysilane compounds (21) to (28).

(21) $H_2N(CH_2)_3Si(OCH_3)_3$
(22) $H_2N(CH_2)_5Si(OCH_3)_3$
(23) $H_2N(CH_2)_7Si(OCH_3)_3$
(24) $H_2N(CH_2)_9Si(OCH_3)_3$
(25) $H_2N(CH_2)_5Si(OC_2H_5)_3$
(26) $H_2N(CH_2)_5Si(OC_2H_5)_3$
(27) $H_2N(CH_2)_7Si(OC_2H_5)_3$
(28) $H_2N(CH_2)_9Si(OC_2H_5)_3$

Among the condensation catalysts which may be included in the reaction mixture, compounds containing a tin (Sn) salt react with amino groups to form a precipitate, and thus cannot be used as the condensation catalyst for amino-group containing alkoxysilane compounds.

Therefore, when an amino-group containing alkoxysilane compound is used, the condensation catalyst may be a single compound or a mixture of two or more of the compounds selected from those used for the epoxy group-containing alkoxysilane compound, except for tin carboxylates, carboxylic acid ester tin salts, tin carboxylate polymers, and tin carboxylate chelates.

The type and combination of the co-catalyst which may be used herein, the type of the solvent, the concentrations of the alkoxysilane compound, condensation catalyst, and co-catalyst, and the conditions and period of the reaction are the same as the case with the epoxy group-containing alkoxysilane compound, so that explanations thereof are omitted.

Film-forming compounds such as alkoxysilyl group-containing pyrrole derivatives and imino group-containing imidazole derivatives are also usable in the same manner as the amino-group containing film-forming compounds. In addition, ketimine derivatives which form amino groups through hydrolysis are also usable.

The ceramic package used as the first adherent in the present embodiment may be replaced with a metal such as aluminum, glass, glass ceramic, or a synthetic resin such as an acrylic resin, a polycarbonate, or an epoxy resin.

When the first bonding surface has an active hydrogen group such as a hydroxy group or an amino group, the film-forming compound may be an alkoxysilane compound as is the case with a ceramic package. When a synthetic resin is used as the adherent, an alkoxysilane compound may be used as the film-forming compound by grafting of a compound containing an active hydrogen group through corona discharge treatment or plasma treatment.
(The Above is Related to Step A)

In the step B, the second film-forming compound having an epoxy group and an alkoxysilyl group at each end of the molecule thereof is brought into contact with the second bonding surface 18 on the edge of the window plate glass 16, which is used as the window material of the image sensor 10, thereby binding the alkoxysilyl group to the hydroxy group of the second bonding surface to selectively form the monomolecular film 23 of the second film-forming compound on the second bonding surface 18 (see FIGS. 3(A) and 3(B)).

The film-forming compound which may be used in the step B and the reaction conditions are the same as the case with the step A, so that detailed explanations thereof are omitted.

The window plate glass used in the present embodiment may be replaced with a substrate of a transparent resin such as an acrylic or polycarbonate resin whose bonding surface has been hydrophilized through, for example, corona discharge treatment.
(The Above is Related to Step B)

In the step C, the first bonding surface 17 having the monomolecular film 22 of the first film-forming compound is brought into contact by pressure with to the second bonding surface 18 having the monomolecular film 23 of the second film-forming compound while setting the epoxy type adhesive to be in contact with the epoxy groups of the first and second film-forming compounds, thereby binding the epoxy groups of the monomolecular films 22 and 23 of the first and second film-forming compounds to the molecule of the epoxy type adhesive forming the adhesive layer 24 (see FIG. 2).

For example, when the epoxy groups of the monomolecular films 22 and 23 of the first and second film-forming compounds react with the amino groups of the curing agent contained in the epoxy type adhesive to form bonds, the bond formation reaction is expressed by Chemical formula 6. In Chemical formula 6, $R_1$ and $R_2$ each independently represent a hydrogen atom, any alkyl group, aryl group, substituted alkyl group, or substituted aryl group.

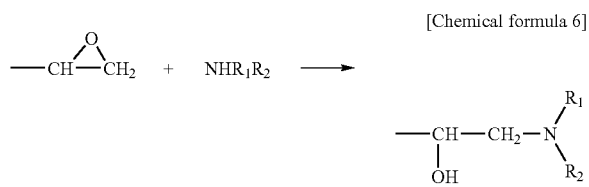

[Chemical formula 6]

The epoxy type adhesive which may be used for the formation of the sealed structure is not particularly limited, and may be any epoxy type adhesive of one-component or two-component type, room temperature curing type, or thermosetting type. The adhesive may be modified with, for example, urethane or nitrile rubber.

Firstly, an epoxy type adhesive is applied on the monomolecular film 22 of the first film-forming compound formed on the first bonding surface 17 and/or the monomolecular film 23 of the second film-forming compound formed on the second bonding surface 18. Application of the epoxy type adhesive may be carried out by, for example, screen printing or ink jet printing.

Secondly, the first bonding surface 17 having the monomolecular film 22 of the first film-forming compound is brought into contact by pressure with the second bonding surface 18 having the monomolecular film 23 of the second film-forming compound thereby binding the epoxy groups of the monomolecular films 22 and 23 of the first and second film-forming compounds to the molecules of the epoxy type adhesive forming the adhesive layer 24 through curing reaction of the epoxy type adhesive.

The conditions for the curing reaction (for example, temperature and pressure) depend on, for example, the type of the epoxy type adhesive and the sizes of the ceramic package 11 and the window plate glass 16.

An epoxy type adhesive may be used also in cases where the first and second film-forming compounds are amino-group containing film-forming compounds, because the amino groups and epoxy groups of the epoxy type adhesive form bonds through the reaction expressed by Chemical formula 6.

The epoxy type adhesive used in the present embodiment may be replaced with other reaction-curable adhesive such as an urethane adhesive.

During curing of the epoxy type adhesive at a high temperature, if the coefficients of linear expansion of the first and second adherents are markedly different, internal stress may occur within the sealed structure to cause its breakage due to the difference of the rates of shrinkage during cooling. Therefore, the first and second adherents may be heated to different temperatures using, for example, a heating block. In this case, it is preferable that the temperature of the first or second adherent having a higher coefficient of linear expansion be lower than the temperature of the other adherent having a lower coefficient of linear expansion. The heating temperatures for the first and second adherents may be adjusted on the basis of their sizes and coefficients of linear expansion such that their deformation volumes are equal during cooling.

In the present embodiment, a sealed structure and a sealing method are described. It is a matter of course that the present invention is also applicable to a bonded structure and a bonding method which are in common with the sealed structure and sealing method in that the structure is formed by bonding together the surfaces of adherents via an adhesive layer, and the method is for forming the structure.

In the present embodiment, an image sensor is illustrated as an instance. The sealed structure according to the present invention is also applicable to semiconductor devices sealed in packages, such as EPROMs, CPLDs (programmable logic devices), CdS cells, and photo-laser diodes, and electronic components such as line sensors, liquid crystal displays (LCDs), plasma display panels (PDPs), electroluminescence (EL) displays, and field emission displays (FEDs).

EXAMPLES

Examples for confirming the effects of the present invention are described below, but the present invention will not limited to these examples.

Example 1

Making of Image Sensor (1) Formation of Monomolecular Films of Film-Forming Compounds (steps A and B)

A ceramic package equipped with an image sensor chip, the image sensor chip having thereon electrode pads that are wire bonded to leads, and a window plate glass were prepared and respectively thoroughly washed and dried.

Thereafter, 0.99 parts by weight of 3-glycidyloxypropyltrimethoxysilane (Chemical formula 7, manufactured by Shin-Etsu Chemical Co., Ltd.) and 0.01 parts by weight of dibutyltin bisacetyl acetonate (condensation catalyst) were weighed and dissolved in 100 parts by weight of hexamethyldisiloxane to make a reaction mixture.

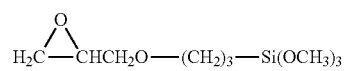

[Chemical formula 7]

The resultant reaction mixture was applied by screen printing onto the bonding surfaces of the ceramic package and window plate glass, and allowed to react for about 2 hours in air at room temperature (relative humidity 45%). Thereafter, the excessive alkoxysilane compound and dibutyltin bisacetyl acetonate were removed through washing with chloroform to form monomolecular films (thickness: about 1 nm) of the epoxy group-containing film-forming compound on the entire bonding surfaces. (see FIG. 3(B)).

The monomolecular films thus formed were very thin and had a thickness of nanometer level, so that they did not impair the configuration of the ceramic package and window plate glass. The films were then allowed to stand in air without washing, the solvent completely evaporated, 3-glycidyloxypropyltrimethoxysilane in the reaction mixture reacted with moisture in air, and thus a ceramic package and a window plate glass each having on the bonding surface thereof a very thin siloxane polymer film containing covalently bonded reactive epoxy groups were obtained. The siloxane polymer film was slightly thicker than the monomolecular film, but almost equivalent to the monomolecular film in the bonding power for the bonding surface and reactivity with the adhesive in the step C.

(2) Formation of Sealed Structure (step C)

An epoxy type adhesive (EP51AO, a two-component epoxy type adhesive for ceramic adhesion, manufactured by Master Bond Inc.) was applied on the bonding surfaces of the ceramic package and window plate glass each having thereon the monomolecular film of the epoxy group-containing film-forming compound which had been selectively formed, the bonding surfaces were brought into contact with each other by pressure, and heated for 1 hour in a heating oven at 100 to 150° C., to seal the image sensor (FIG. 1).

The epoxy groups of the monomolecular films of the film-forming compound covalently bonded to the bonding surfaces of the ceramic package and window plate glass reacted with the amino groups of the molecules of the curing agent contained in the adhesive to form bonds, whereby the monomolecular films of the film-forming compound selectively and chemically bound to the bonding surfaces were bound to the adhesive layer formed by curing of the adhesive (FIG. 2). As a result of this, an image sensor having markedly high hermetic sealing properties was obtained.

Example 2

Making of Electroluminescence Display (1) Formation of Monomolecular Film of Film-Forming Compound (steps A and B)

A glass substrate having an electroluminescence (EL) array, and a resin film for covering the back face were respectively thoroughly washed and dried. The edges of the resin film had been hydrophilized through corona discharge treatment.

Thereafter, 0.99 parts by weight of 3-aminopropyltrimethoxysilane (Chemical formula 8, manufactured by Shin-Etsu Chemical Co., Ltd.) and 0.01 parts by weight of acetic acid (condensation catalyst) were weighed and dissolved in 100 parts by weight of hexamethyldisiloxane to make a reaction mixture.

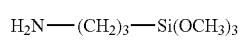

[Chemical formula 8]

$H_2N-(CH_2)_3-Si(OCH_3)_3$

The resultant reaction mixture was applied by screen printing onto the bonding surfaces of the glass substrate and resin film, and allowed to react for about 2 hours in air at room temperature (relative humidity 45%) to form on the entire bonding surfaces thin polymer films (thickness: about 50 nm) of the film-forming compound having amino groups bound to the substrates.

(2) Formation of Sealed Structure (step C)

An epoxy type adhesive (EP51AO, a two-component epoxy type adhesive for ceramic adhesion, manufactured by Master Bond Inc.) was applied to the bonding surfaces of the glass substrate and resin film each having thereon the polymer film of the amino group-containing film-forming compound which had been selectively formed, the bonding surfaces were brought into contact with each other by pressure, and heated for 2 hours in a heating oven at 70 to 90° C., whereby the EL array was sealed therein.

The amino groups of the polymer films covalently bonded to the bonding surfaces of the glass substrate and resin film reacted with the epoxy groups of the molecules of the adhesive to form bonds, whereby the polymer films selectively and chemically bound to the bonding surfaces were bound to the adhesive layer formed by curing of the adhesive. As a result of this, an EL display having markedly high hermetic sealing properties was obtained.

| Reference Numerals | |
|---|---|
| 10 | image sensor |
| 11 | ceramic package |
| 12 | sensor chip |
| 13 | lead |
| 14 | electrode pad |
| 15 | electrically conductive wire |
| 16 | window plate glass |
| 17 | first bonding surface |
| 18 | second bonding surface |
| 21 | sealed structure |
| 22 | monomolecular film of first film-forming compound |
| 23 | monomolecular film of second film-forming compound |
| 24 | adhesive layer |
| 25 | hydroxy group |

The invention claimed is:

1. A sealing method comprising:
bringing a first film-forming compound comprising at a first end of the compound a first functional group configured to form a covalent bond with an adhesive, and at a second end of the compound a first surface bonding group, into contact with a first bonding surface of a first adherent to covalently bond the first surface bonding group to a surface functional group of the first bonding surface to form a film of the first film-forming compound on the first bonding surface;
bringing a second film-forming compound comprising at a first end of the compound a second functional group configured to form a covalent bond to the adhesive, and at a second end of the compound a second surface bonding group, into contact with a second bonding surface of a second adherent to covalently bond the second surface bonding group to a surface functional group of the second bonding surface to form a film of the second film-forming compound on the second bonding surface; and
contacting under pressure the first functional group with the adhesive to form a covalent bond between the first functional group and the adhesive, and the second functional group with the adhesive to form a covalent bond between the second functional group and the adhesive.

2. The sealing method according to claim 1, wherein the first and second functional groups are amino groups or imino groups, and the adhesive comprises an epoxy group.

3. The sealing method according to claim 1, the first and second surface bonding groups are alkoxysilyl groups.

4. The sealing method according to claim 1, wherein the first adherent has a coefficient of linear expansion that is greater than a coefficient of linear expansion of the second adherent and during the contacting a temperature of the first adherent is lower than a temperature of the second adherent.

5. The sealing method according to claim 1, wherein the film of the first film-forming compound is a monomolecular film, and the film of the second film-forming compound is a monomolecular film.

* * * * *

UNITED STATES PATENT AND TRADEMARK OFFICE
CERTIFICATE OF CORRECTION

PATENT NO. : 8,366,867 B2  
APPLICATION NO. : 12/664723  
DATED : February 5, 2013  
INVENTOR(S) : Ogawa Page 1 of 1

It is certified that error appears in the above-identified patent and that said Letters Patent is hereby corrected as shown below:

On Title Page 2, Item (56), under "FOREIGN PATENT DOCUMENTS",
in Column 1, Line 5, delete "3/1994" and insert -- 5/2007 --, therefor.

In the Specification

In Column 1, Line 52, delete "5-174733" and insert -- 5-174733. --, therefor.

In Column 1, Line 55, delete "2005-534048" and insert -- 2005-534048. --, therefor.

In Column 1, Line 57, delete "2007-13026" and insert -- 2007-13026. --, therefor.

In Column 8, Lines 55-56, delete "Reaction Mixture May Use Organic Chlorine Solvents," and insert -- reaction mixture may use organic chlorine solvents, --, therefor.

In Column 11, Line 48, delete "an" and insert -- a --, therefor.

In the Claims

In Column 14, Line 49, in Claim 3, delete "the first" and insert -- wherein the first --, therefor.

Signed and Sealed this
Eleventh Day of June, 2013

Teresa Stanek Rea
*Acting Director of the United States Patent and Trademark Office*